United States Patent
Park et al.

(10) Patent No.: US 7,023,064 B2
(45) Date of Patent: Apr. 4, 2006

(54) TEMPERATURE STABLE METAL NITRIDE GATE ELECTRODE

(75) Inventors: Dae-Gyu Park, Wappingers Falls, NY (US); Cyril Cabral, Jr., Ossining, NY (US); Oleg Gluschenkov, Poughkeepsie, NY (US); Hyungjun Kim, Lagrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/710,063

(22) Filed: Jun. 16, 2004

(65) Prior Publication Data

US 2005/0280099 A1    Dec. 22, 2005

(51) Int. Cl.
    *H01L 29/76*      (2006.01)
(52) U.S. Cl. ............... 257/412; 257/407; 257/413; 257/649; 257/900; 257/410; 257/411
(58) Field of Classification Search .......... 257/410, 257/411, 412, 413, 407, 649, 900, 369, 377; 438/591, 301, 231, 232, 307
    See application file for complete search history.

(56) References Cited

U.S. PATENT DOCUMENTS

| | | | |
|---|---|---|---|
| 5,888,588 A | 3/1999 | Nagabushnam et al. | |
| 6,096,641 A | 8/2000 | Kunikiyo | |
| 6,162,715 A | 12/2000 | Mak et al. | |
| 6,274,484 B1 | 8/2001 | Tsai et al. | |
| 6,340,629 B1 | 1/2002 | Yeo et al. | |
| 6,417,085 B1* | 7/2002 | Batra et al. | 438/591 |
| 6,552,388 B1* | 4/2003 | Wilk et al. | 257/324 |
| 6,815,285 B1* | 11/2004 | Choi et al. | 438/231 |
| 2002/0022134 A1* | 2/2002 | Fujino et al. | 428/432 |
| 2004/0166644 A1* | 8/2004 | Powell | 438/301 |

OTHER PUBLICATIONS

Theory Of Bonding In Transition-Metal Carbides And Nitrides, J. Haglund, et al., Phys. Rev. B 48, 11685 (Oct. 15, 1993).

* cited by examiner

*Primary Examiner*—Nathan Flynn
*Assistant Examiner*—Fazli Erdem
(74) *Attorney, Agent, or Firm*—Ira D. Blecker

(57) ABSTRACT

An integrated circuit is provided including an FET gate structure formed on a substrate. This structure includes a gate dielectric on the substrate, and a metal nitride layer overlying the gate dielectric and in contact therewith. This metal nitride layer is characterized as $MN_x$, where M is one of W, Re, Zr, and Hf, and x is in the range of about 0.7 to about 1.5. Preferably the layer is of $WN_x$, and x is about 0.9. Varying the nitrogen concentration in the nitride layer permits integration of different FET characteristics on the same chip. In particular, varying x in the $WN_x$ layer permits adjustment of the threshold voltage in the different FETs. The polysilicon depletion effect is substantially reduced, and the gate structure can be made thermally stable up to about 1000° C.

10 Claims, 18 Drawing Sheets

TEMPERATURE STABLE METAL NITRIDE GATE ELECTRODE

BACKGROUND OF INVENTION

This application is related to Application No. FIS9-2003-0417-US1, "High temperature stable gate structure with metallic electrode," filed the same day and assigned to the same assignee as the present application. The disclosure of the related application is incorporated herein by reference.

This invention relates to the manufacture of advanced semiconductor devices, particularly complementary metal-oxide-semiconductor (CMOS) FET devices, including p-type and n-type FETs (PFETs and NFETs respectively). More particularly, the invention relates to fabrication of gate structures for these devices having stable electrical and chemical characteristics at temperatures up to 1000° C.

The ongoing reduction in size of electronic device elements poses problems in device performance which must be addressed using new materials and fabrication techniques. In the case of gate structures for high-performance CMOS devices, the equivalent oxide thick-ness of the gate dielectric has been reduced to about 1.2 nm. A typical CMOS gate structure is shown schematically in FIG. 1. Gate structure 10 is fabricated on the surface of substrate 1, which has source and drain regions 2, 3 formed therein. Gate structure 10 includes conducting element 11 (typically polysilicon; p+ doped and n+ doped in PFETs and NFETs respectively) overlying dielectric layer 12. If a conventional oxynitride gate dielectric is used, decreasing the thickness below about 1.2 nm (equivalent oxide thickness) causes the gate leakage current to become unacceptably high. In a structure such as shown in FIG. 1, the total gate electrical thickness may be viewed as having three components: the equivalent oxide thickness of the gate dielectric (about 1.2 nm), the quantum-mechanical effect of the substrate (about 0.4 nm), and the polysilicon depletion effect (about 0.3 to 0.4 nm). With present-day gate dielectric thicknesses, the polysilicon depletion effect accounts for a substantial component of the total gate electrical thickness. The polysilicon depletion effect occurs when the gate is turned on and a region devoid of charge forms at the polysilicon/dielectric interface (interface 12a in FIG. 1). The appearance of this depletion region reduces the capacitance of the gate and thus increases the electrical thickness. If the polysilicon depletion region could be eliminated, the electrical dielectric thickness would be reduced with no substantial increase in the leakage current. This would permit improved device performance without a further reduction in the thickness of the gate dielectric 12.

Linewidths are also being reduced to less than 65 nm. In the case of CMOS, this means that the lateral extent of gate structure 10 is now in the sub-65 nm range. If a gate structure about this size is designed with a gate dielectric equivalent thickness of about 1 nm, a conventional oxynitride gate dielectric can no longer be used due to unacceptably high leakage currents. It then becomes necessary to substitute high-k gate dielectric materials for the conventional gate oxide or oxynitride; this serves to lower the gate leakage current by 4 to 5 orders of magnitude.

However, the combination of polysilicon for the gate conductor 11 with a high-k material for the gate dielectric 12 presents further problems. As is understood by those skilled in the art, interactions between the materials can cause a shift in the threshold voltage $V_t$ due to pinning of the Fermi level in the gate conductor. In particular, an increased $V_t$ may prevent proper function in a PFET. Another problem affecting PFET performance is that of penetration of boron from the p+ type polysilicon into the high-k dielectric and possibly into the channel region of the device; this effect renders the device unusable.

Accordingly, in a PFET device (at least) it is desirable to eliminate the polysilicon from the gate structure (or at least remove the polysilicon from contact with the gate dielectric), as several benefits may be obtained. The elimination of the polysilicon depletion effect would decrease the effective electrical thickness of the gate dielectric. Interactions between the polysilicon and gate dielectric materials would be avoided, which in turn would avoid the problem of boron penetration. This would lead to faster devices which consume less power.

Recently there has been substantial interest in replacing polysilicon gate conductors with metal gate electrodes, so that the gate conductor 11 is a metal in both NFET and PFET devices. In order to provide appropriate threshold voltages in the two types of devices, two different metals are typically needed. In addition, the NFET and PFET require metals with different workfunctions. Generally an NFET device should have a workfunction in the range 4.1 to 4.3 eV; a PFET device should have a workfunction over 5.0 eV. Furthermore, the interface 12a between the metal and the gate dielectric should be stable during the high-temperature processing steps in the fabrication of the CMOS devices.

There are two possible integration approaches for metal gate conductors in CMOS; these are referred to as the "conventional processing" approach and the "replacement gate" approach. In the conventional processing approach, the metal is in contact with the gate dielectric during the high-temperature (above 1000° C.) activation annealing steps for the dopants in the source and drain regions. The metal must not interact with the dielectric material during the annealing steps. In the replacement gate approach, the CMOS structure is first formed with polysilicon gate electrodes; after all of the high-temperature processing steps, the polysilicon and gate dielectric are removed and a new dielectric is formed, followed by deposition of the metal gate conductor. With this approach the metal/dielectric interface need be stable only up to about 500° C.

It therefore is desirable that CMOS PFET and NFET devices be fabricated with gate structures that avoid the above-described problems of polysilicon depletion, leakage current, and boron penetration, and are also thermally stable when used in conjunction with either an oxynitride gate dielectric or a high-k gate dielectric. Such structures would allow for faster devices that consume less power, particularly when high-k gate dielectrics are used.

SUMMARY OF INVENTION

The present invention provides a gate structure for a CMOS device that offers temperature stability, a substantially reduced polysilicon depletion effect, and numerous other advantages. This gate structure has a metal nitride layer in contact with the gate dielectric, where the nitrogen concentration in the layer is increased.

In accordance with the present invention, an integrated circuit is provided including an FET gate structure formed on a substrate. This structure, which is in an NFET device, includes a gate dielectric on the substrate, and a metal nitride layer overlying the gate dielectric and in contact therewith. This metal nitride layer is characterized as $MN_x$, where M is one of W, Re, Zr, and Hf, and x is less than about 0.7.

The circuit may also include a PFET device having a second gate structure including a second gate dielectric and a second metal nitride layer overlying the second gate dielectric and in contact therewith; this second metal nitride layer is likewise characterized as $MN_x$, where M is one of W, Re, Zr, and Hf, but has x in the range of about 0.7 to about 1.5, and preferably about 0.9.

The metal nitride layer may have a thickness of less than about 100 Å, in order to avoid delamination at high temperatures. In addition, if the metal nitride layer is tungsten nitride, the layer may be covered with a layer of polysilicon, to avoid dissociation of $WN_x$ at about 800° C. The layer of polysilicon is effective to render the gate structure substantially stable with respect to temperature up to about 1000° C.

According to another aspect of the invention, the circuit may include both a PFET device and an NFET device, with the metal nitride layer included in a PFET device but not in the NFET device. The NFET device has a first layer of polysilicon, and a second layer of polysilicon overlies the metal nitride layer in the NFET device. Furthermore, the first and second polysilicon layers may be of the same material. In particular, both layers may be of n+ doped polysilicon.

The present invention also provides a method for fabricating a gate structure for an integrated circuit on a substrate having a PFET region and an NFET region. This method includes the steps of forming a gate dielectric on the substrate; forming a metal nitride layer overlying the gate dielectric and in contact therewith, the metal nitride layer being characterized as $MN_x$, where M is one of W, Re, Zr, and Hf; covering the metal nitride layer with a hardmask layer in one of the PFET region and the NFET region; adjusting the nitrogen content of the metal nitride layer in the region not covered by the hardmask layer; forming a PFET gate structure in the PFET region; and forming an NFET gate structure in the NFET region. In the adjusting step, the nitrogen content is decreased when the hardmask layer covers the metal nitride layer in the PFET region, and increased when the hardmask layer covers the metal nitride layer in the NFET region. The metal nitride layer in the PFET region is preferably $WN_x$, x in the range of about 0.7 to about 1.5, and the metal nitride layer in the NFET region is preferably $WN_x$, x less than about 0.7. The hardmask layer is preferably a polysilicon layer, which is effective to render the gate structure formed in the region having the hardmask layer substantially stable with respect to temperature at temperatures up to about 1000° C.

The step of forming the PFET gate structure may include forming a first layer of polysilicon above the metal nitride layer, while the step of forming the NFET gate structure may include forming a second layer of polysilicon above the metal nitride layer; the first layer of polysilicon and the second layer of polysilicon may be of the same material. In particular, the first polysilicon layer and said second polysilicon layer may both be n+ doped polysilicon.

According to an additional aspect of the invention, a method for fabricating a gate structure for an integrated circuit on a substrate is provided, where the substrate has a PFET region and an NFET region. This method includes the steps of forming a gate dielectric on the substrate; forming a metal nitride layer overlying the gate dielectric and in contact therewith, where the metal nitride layer is characterized as $MN_x$, where M is one of W, Re, Zr, and Hf; covering the metal nitride layer in the PFET region with a hardmask layer; removing the metal nitride layer in the NFET region; forming a PFET gate structure in the PFET region; and forming an NFET gate structure in the NFET region.

The above-described gate structures may also be fabricated by dual-metal gate and replacement-gate processes.

DETAILED DESCRIPTION

Temperature-Stable Gate Structures

Figure 2A:
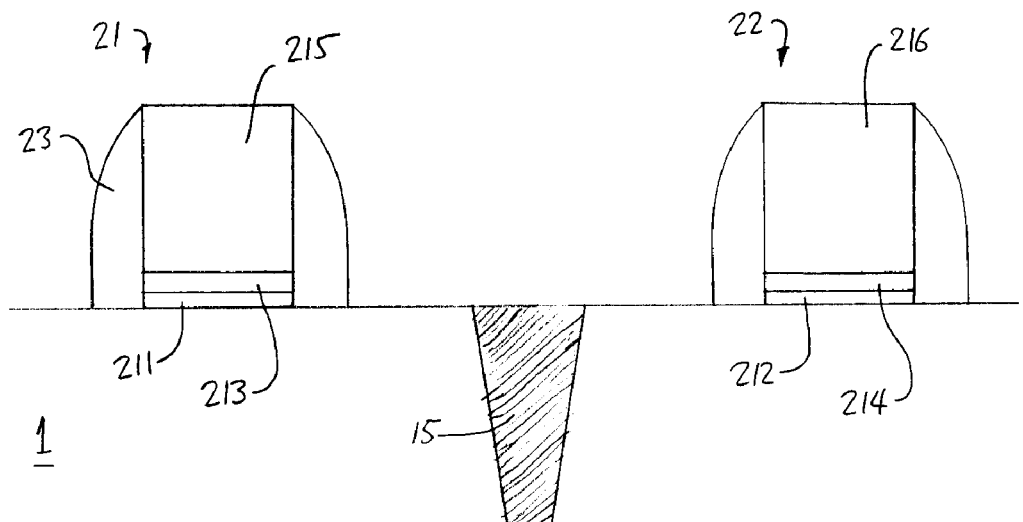
FIG. 2A illustrates NFET and PFET gate structures incorporating metal nitride layers and polysilicon, in accordance with an embodiment of the invention.
Figure 2B:
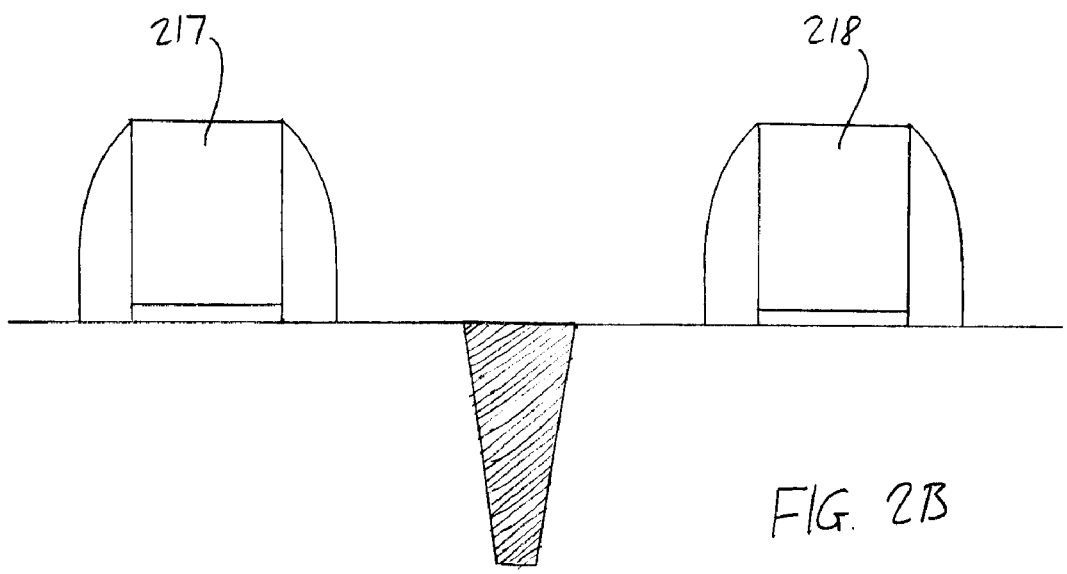
FIG. 2B illustrates NFET and PFET gate structures incorporating a metal or metal nitride formed in a replacement gate process, in accordance with another embodiment of the invention.

FIGS. 2A and 2B are schematic illustrations of CMOS gate structures fabricated in accordance with the present invention. NFET and PFET devices are typically fabricated in pairs, while being electrically isolated from each other. This is illustrated in FIG. 2A and subsequent figures by NFET gate 21, PFET gate 22 (each having a gate stack, a gate dielectric, and spacers 23) and trench isolation 15 between them. Other details of the NFET and PFET devices (such as the source and drain regions formed in substrate 1) are omitted for the sake of clarity.

Each of the gate structures 21, 22 in FIG. 2A has a refractory metal nitride layer 213, 214 in contact with the gate dielectric 211, 212 in the NFET and PFET devices respectively. The refractory metal nitride layer is generally $MN_x$, where M indicates a metal such as W, Re, Zr, or Hf, and x indicates the proportion of nitrogen in the nitride. A preferred material is tungsten nitride, $WN_x$. Tungsten nitride typically has a stoichiometric composition $W_2N$ (that is, x=0.5). In the present invention, however, additional nitrogen is introduced into the nitride layer to adjust the workfunction in the PFET device. It has been found that incorporation of nitrogen into tungsten causes the workfunction to increase from a midgap value of 4.65 eV (workfunction for pure W) to over 5.0 eV when x is made greater than 0.5. If nitrogen is introduced into tungsten such that a tungsten nitride film is formed with x about 0.9, a PFET gate electrode may be formed with a work-function of 5.1 eV. Accordingly, adjusting the nitrogen concentration in a tungsten film permits integration of two different gate materials for the NFET and PFET respectively. In the embodiment shown in FIG. 2A, layer 213 in the NFET gate structure 21 is $WN_x$ with x less than about 0.7, while layer 214 in the PFET structure is $WN_x$ with x in the range 0.7 to 1.5, preferably about 0.9. Layers 213, 214 in practice may be combinations of metal layers and nitride layers (as discussed in more detail in related application FIS9-2003-0417), provided that the layer in direct contact with the gate dielectric is a nitride.

The tungsten nitride films 213, 214 are unstable at the high temperatures used in some CMOS fabrication processes. Dissociation of $WN_x$ occurs at about 800° C., leaving behind pure W. The present inventors have found that this problem is avoided by covering the tungsten nitride layers 213, 214 with layers of polysilicon 215, 216. This has the effect of shifting the dissociation transition temperature to above 1000° C., thereby making the gate structures stable during high-temperature processes such as source/drain dopant activation annealing steps. Layers 215 and/or 216 may be converted to a silicide, using techniques known in the art. The choice of which silicide, if any, to form at the top of the gate structure will be made in accordance with the objective of lowering the overall gate resistance.

It should be noted that the workfunction in the respective devices is set by appropriately choosing the nitrogen content in layers 213, 214. This in turn means that the composition of conducting elements 215, 216 can be common to both devices, in contrast with conventional devices where n+ polysilicon is generally used for NFETs and p+ polysilicon is used for PFETs.

It is also known that $WN_x$ films thicker than about 100 Å may easily delaminate at high temperatures. In this embodiment, this problem is avoided by limiting the thickness of layers 213, 214 to less than 100 Å.

An alternative embodiment is shown in FIG. 2B, where a replacement gate process is used to form gate electrodes 217, 218 in the NFET and PFET devices respectively. The NFET gate electrode 217 is a metal or metal nitride (such as $WN_x$ with x less than about 0.7), or a combination thereof. The PFET gate electrode 218 is a metal nitride with an increased concentration of nitrogen, preferably $WN_x$ with x in the range 0.7 to 1.5. (Electrode 218 may also be a combination of a metal and a metal nitride, with the metal nitride in contact with the gate dielectric, and the metal on top of the nitride.) In this embodiment, the metal/nitride layers can be thicker than 100 Å and a polysilicon capping layer is not required, since the maximum temperature in a replacement gate process is typically less than about 500° C.

Fabrication Process: Conventional CMOS Approach

Figure 3A:
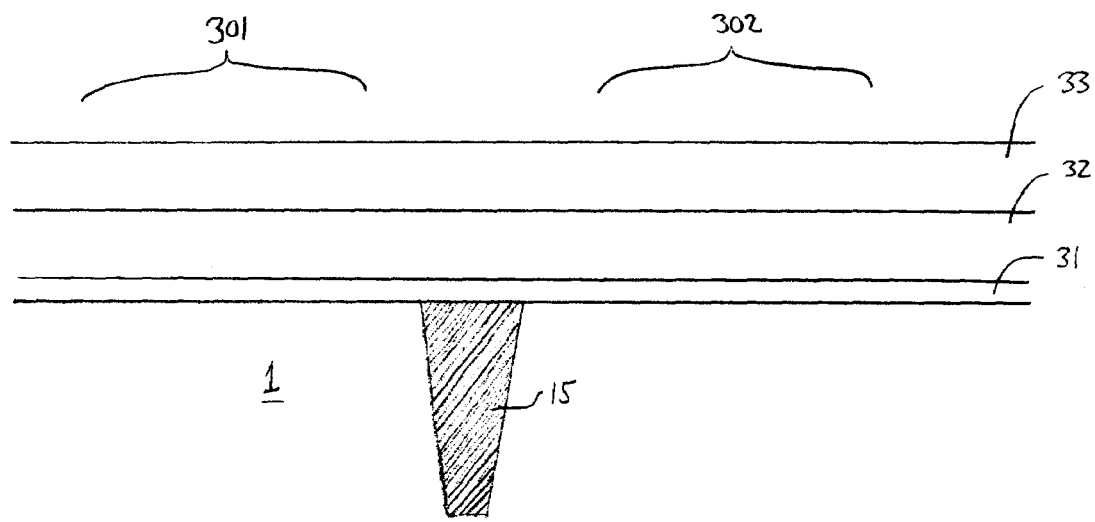
FIGS. 3A–3D illustrate steps in a gate structure fabrication process for NFET and PFET devices in accordance with an embodiment of the invention, where tungsten nitride layers are formed with different nitrogen concentrations in the NFET and PFET respectively.

FIG. 3A illustrates the beginning of a fabrication process leading to formation of NFET and PFET gate structures as shown in FIG. 2A. The portion of substrate 1 shown is divided into an NFET region 301 and a PFET region 302, with isolation 15 between these two regions. Substrate 1 has gate dielectric 31 formed thereon; this layer may be oxynitride, but a high-k material is preferable. A layer of metal nitride (preferably tungsten nitride) 32 is formed overlying the gate dielectric. A hardmask 33 is deposited on top of the nitride layer; polysilicon is a useful hardmask material.

Nitride layer 32 can be prepared using a variety of techniques. For example, tungsten nitride can be prepared by physical vapor deposition (including sputtering, molecular-beam epitaxy, or e-beam evaporation) of W in an $NH_3$ or $N_2$ ambient; by atomic layer deposition (ALD) or chemical vapor deposition (CVD) using $WF_6$ (or $W(CO)_6$) and $NH_3$ precursors; or by plasma nitridation. Other refractory metal nitrides may be prepared using similar techniques.

Figure 1:
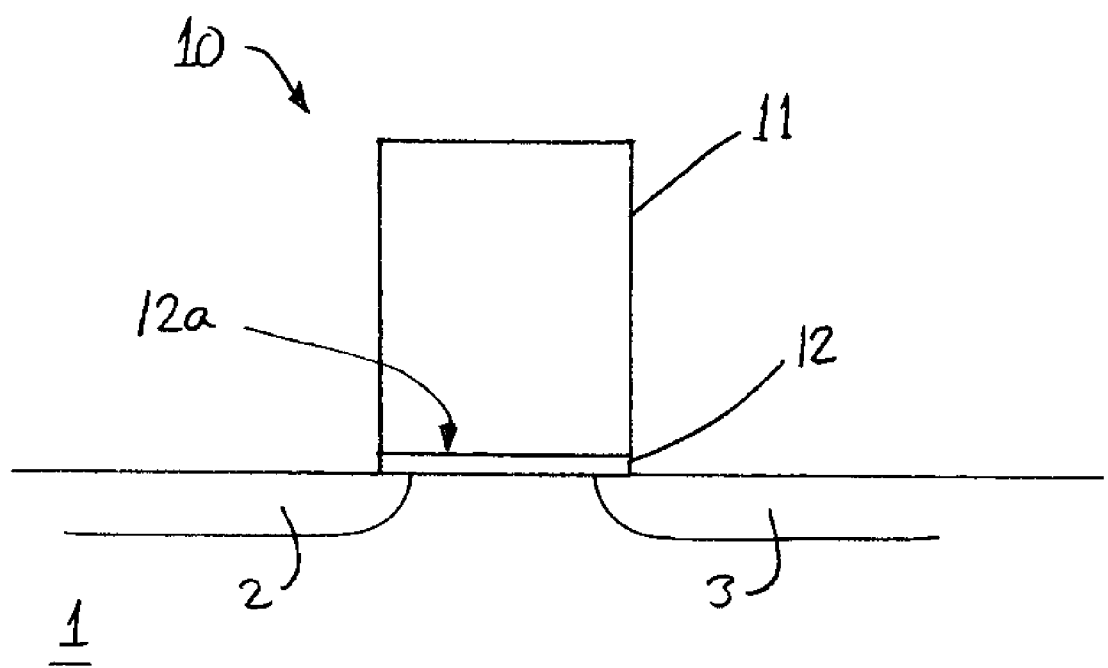
FIG. 1 is a schematic illustration of a typical CMOS gate structure.
Figures 1, 3B:
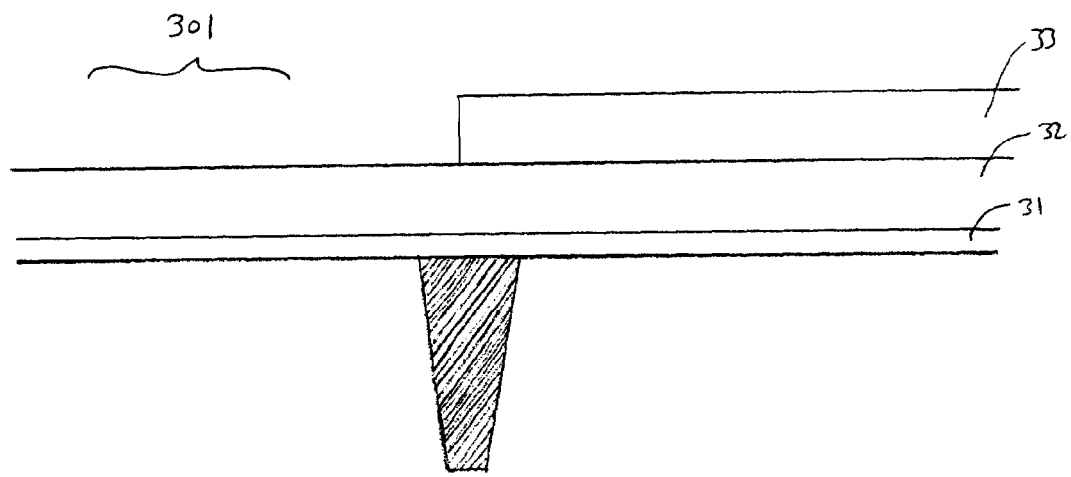

If layer 32 is prepared with a high concentration of nitrogen (such as $WN_x$ with x>0.7), then mask 33 is patterned so as to expose region 301 (see FIG. 3B-1). The exposed portion of layer 32 is then annealed, so as to remove nitrogen from the layer in region 301. Controlling the annealing temperature permits control of the decomposition of the nitride layer, which in turn determines the ultimate nitrogen content in the layer and hence the workfunction of the nitride material. Portion 32a of the nitride layer thus has a reduced concentration of nitrogen (FIG. 3C-1). Accordingly, gate structures may be formed with nitride layers such as $WN_x$ with different values of x in the NFET and PFET regions. Mask layer 33 is then optionally removed, and processing continues using techniques known in the art. The resulting gate structures are shown in FIG. 3D. The NFET gate structure 35 has gate dielectric 311, $WN_x$ layer 341 with x<0.7, and a cap layer (a conducting material, typically polysilicon or silicide) 351. The PFET gate structure 36 has gate dielectric 312, $WN_x$ layer 342 with x>0.7, and cap layer 352.

Figures 2, 3B:
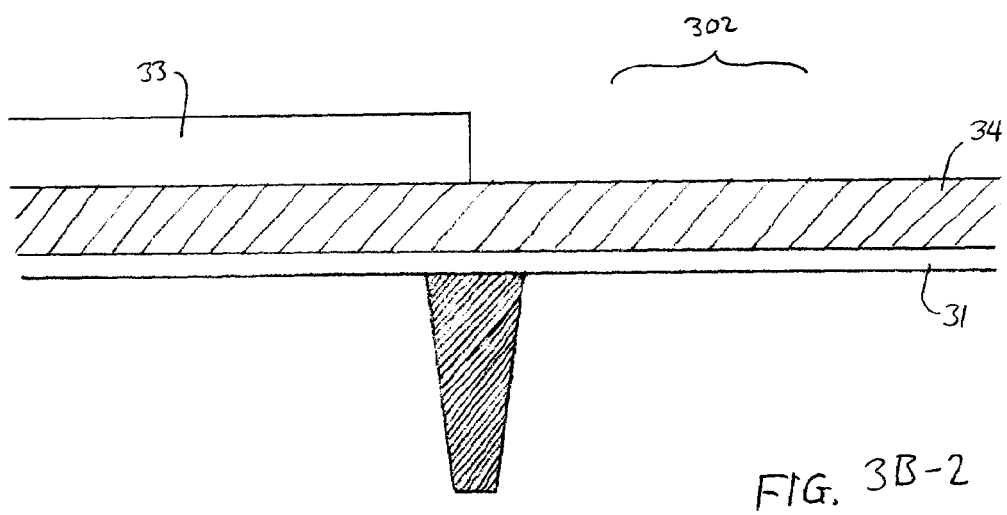
Figures 1, 3C:
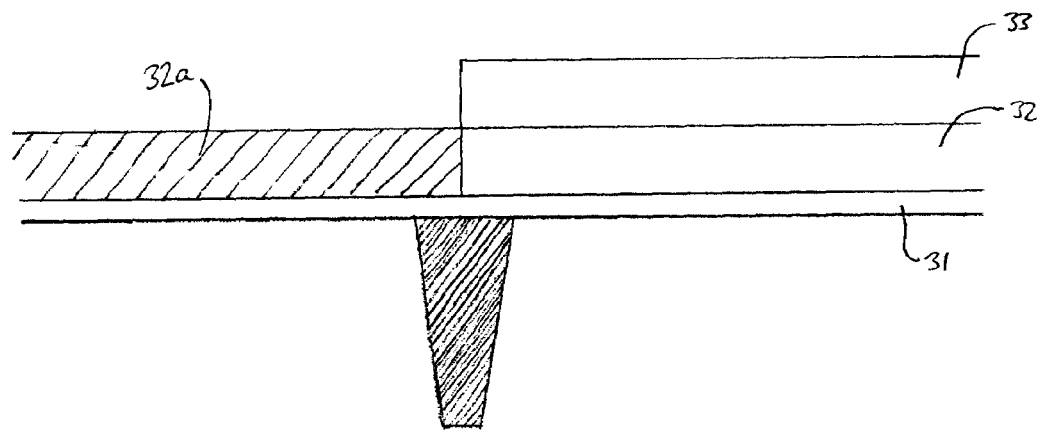
Figures 2, 3C:
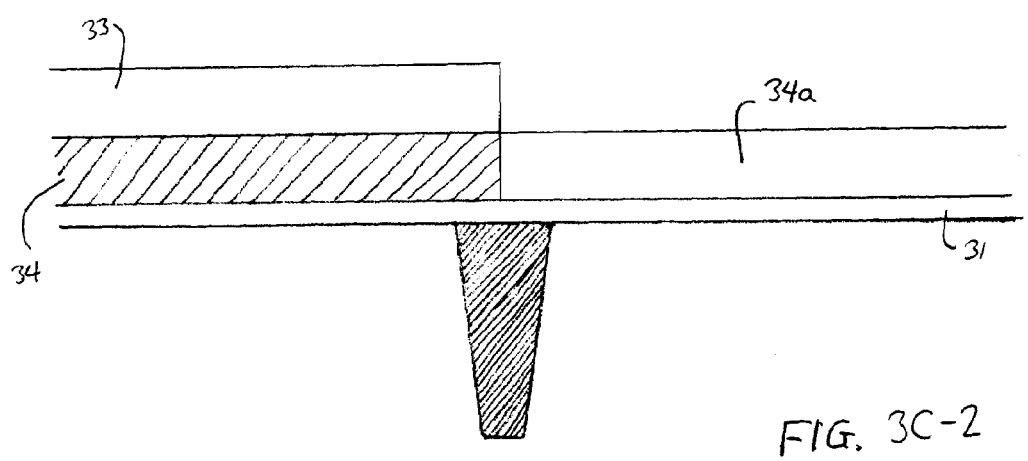
Figure 3D:
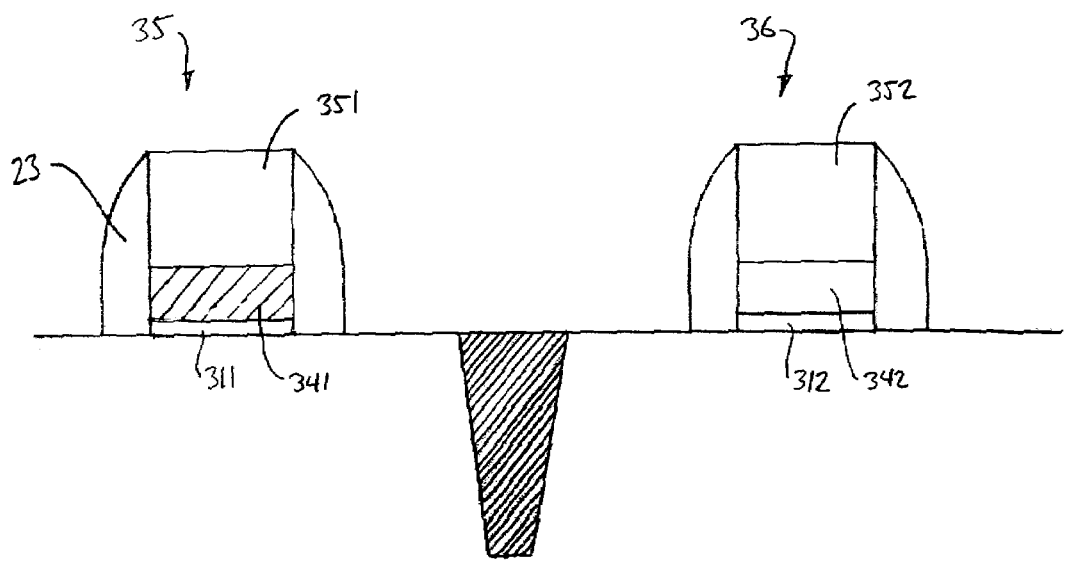

Alternatively, if the nitride layer is prepared with a low concentration of nitrogen (such as $WN_x$ with x<0.7), then mask 33 is patterned so as to expose region 302 (see FIG. 3B-2). FIG. 3B-2 shows a nitride layer 34 having a low concentration of nitrogen, with a portion covered by mask 33 and a portion 34a exposed. The exposed portion 34a is then treated so as to introduce nitrogen into that portion; this may be done by annealing in an $NH_3$ or $N_2$ ambient, N ion implantation, plasma nitridation, or some other method. Portion 34a of the nitride layer thus has an increased concentration of nitrogen (FIG. 3C–2). Mask layer 33 is then optionally removed, and processing continues, resulting in formation of gate structures 35, 36 as shown in FIG. 3D.

Figure 4A:
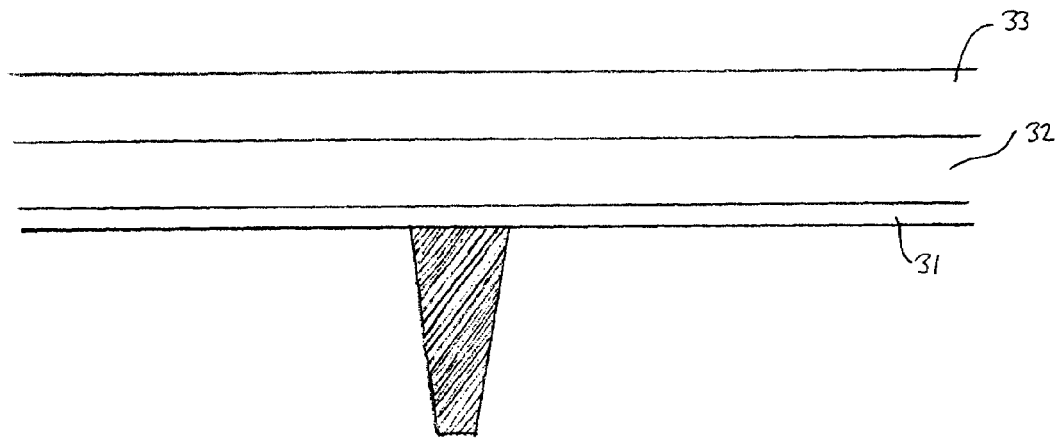
FIGS. 4A–4C illustrate steps in an alternative gate structure fabrication process for NFET and PFET devices, where a tungsten nitride layer is formed in a PFET, and n+ doped polysilicon is used in both the NFET and PFET.
Figure 4B:
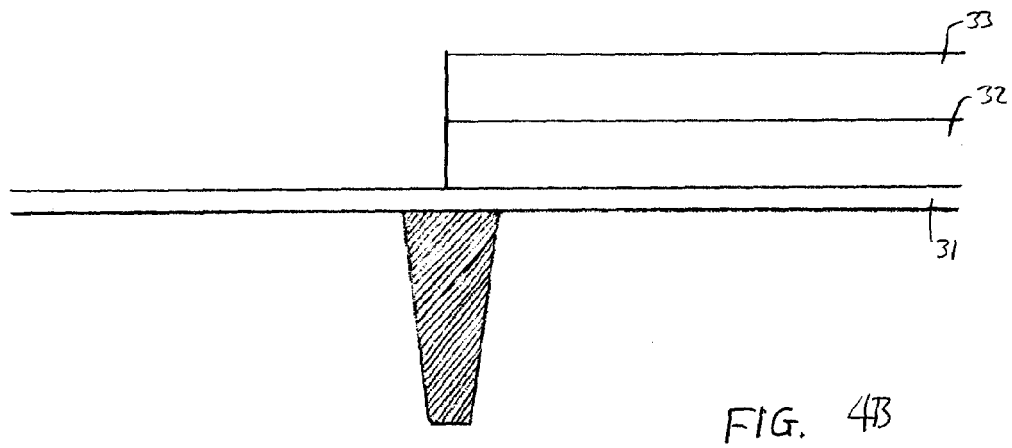
Figure 4C:
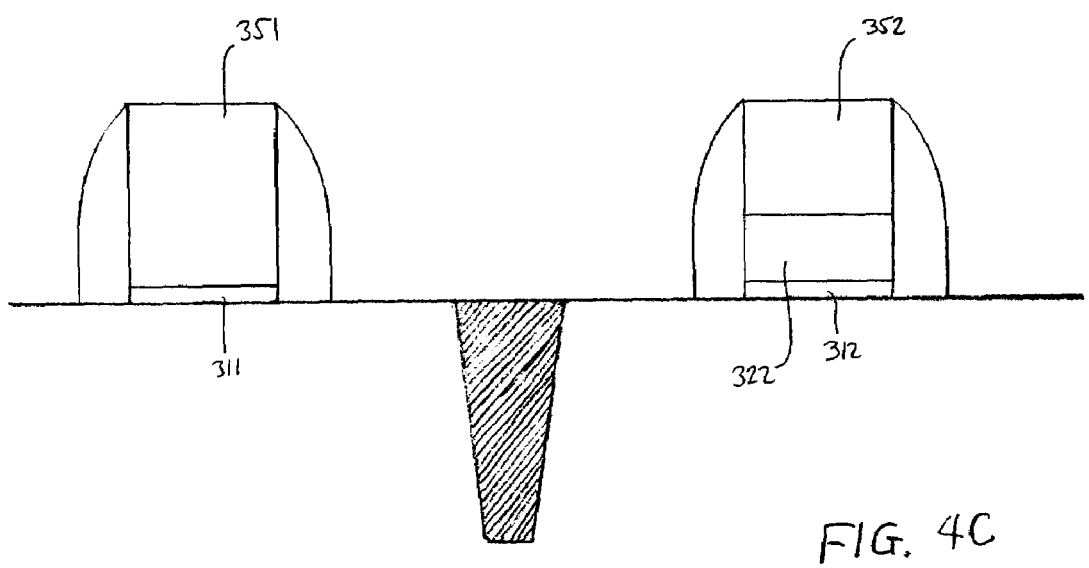

Another alternative process is shown in FIGS. 4A–4C. The substrate is prepared with gate dielectric layer 31, metal nitride layer 32, and mask layer 33 as described above (see FIG. 4A). In this example, it is assumed that layer 32 has a high concentration of nitrogen (such as $WN_x$ with x>0.7), so that layer 32 is suitable for inclusion in a PFET gate structure. The mask 33 is patterned to expose the NFET region, and layer 32 is etched away in this region (FIG. 4B). Conventional CMOS processing (details of which are known in the art) then continues; the resulting gate structures are shown in FIG. 4C. The NFET gate structure has gate dielectric 311 and polysilicon electrode 351; the PFET gate structure has gate dielectric 312, metal nitride layer 322, and polysilicon layer 352. It should be noted that in this embodiment, layers 351 and 352 are both of n+ polysilicon; that is, a common material is used for both layers. As discussed above, the workfunction in the PFET gate structure is selected by adjusting the nitrogen content in the nitride layer 322; accordingly, n+ polysilicon may be used in layer 352. In contrast to structure 21 in FIG. 2A, the NFET lacks a nitride layer; the n+ polysilicon in layer 351 (in contact with the NFET gate dielectric 311) is used to set the workfunction in the NFET gate structure.

Fabrication Process: Dual-Metal Gate

Figure 5A:
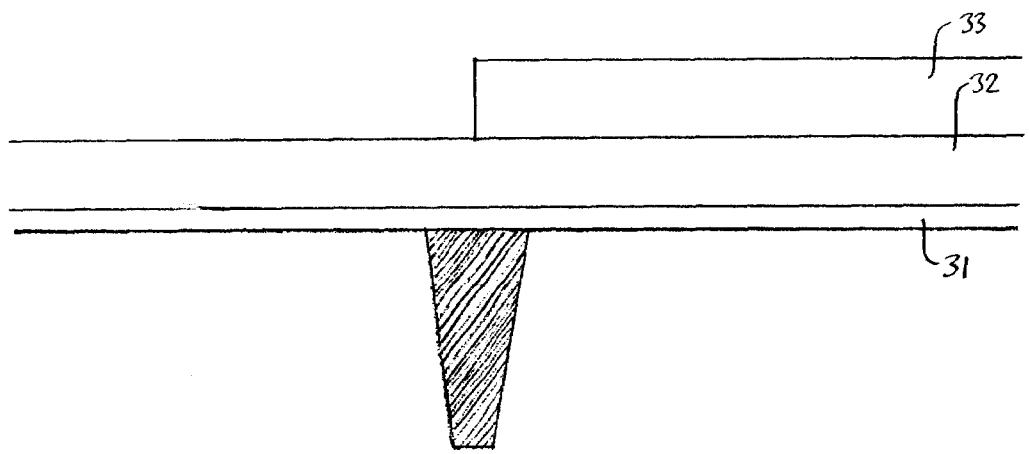
FIGS. 5A–5D illustrate steps in a dual-metal-gate process for NFET and PFET gate structures, in accordance with an another embodiment of the invention.
Figure 5B:
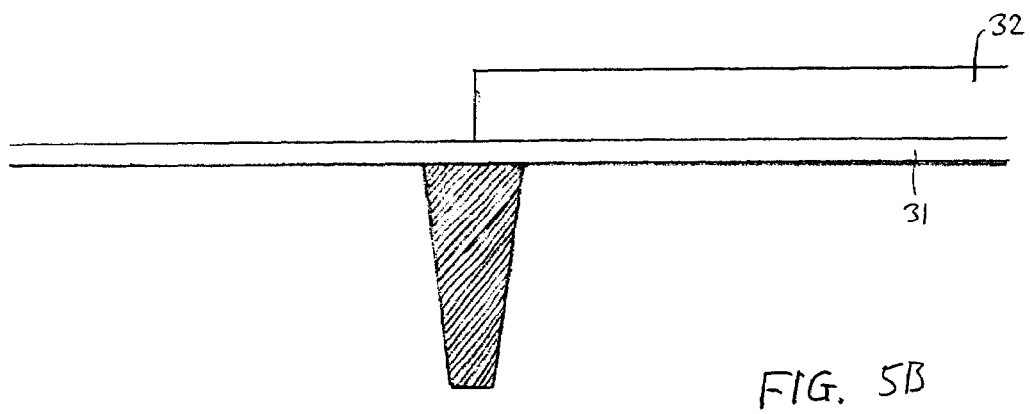

A dual-metal gate approach to fabrication of the NFET and PFET gate structures is shown in FIGS. 5A–5D. The substrate is prepared with dielectric, metal nitride and mask layers 31, 32, 33 as described above (FIG. 5A). In this example, it is assumed that layer 32 has a high concentration of nitrogen (such as $WN_x$ with x>0.7), so that layer 32 is suitable for inclusion in a PFET gate structure. The mask 33 is patterned to expose the NFET region, and layer 32 is etched away in this region (FIG. 5B).

Figure 5C:
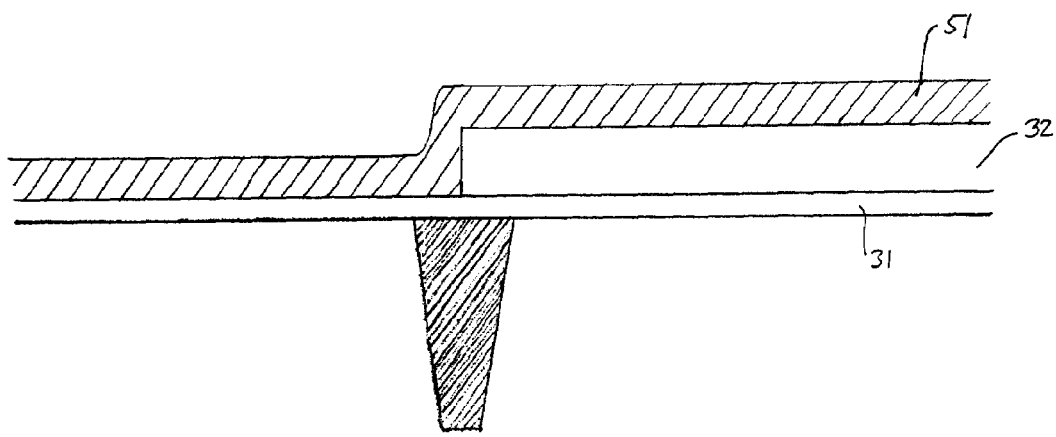
Figure 5D:
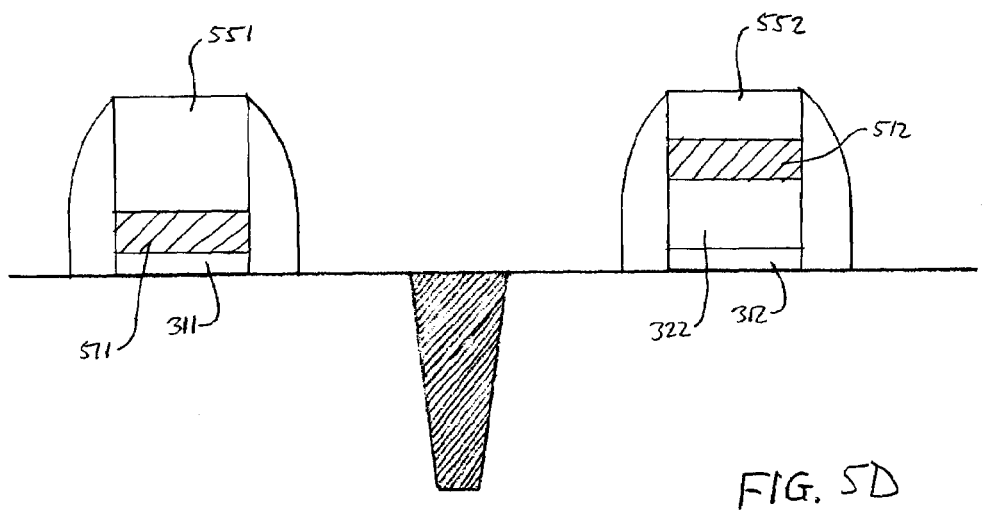

A layer 51 of metal or metal nitride is then deposited, overlying the gate dielectric in the NFET region and overlying metal nitride layer 32 in the PFET region (FIG. 5C). Conventional CMOS processing then continues, resulting in formation of gate structures as shown in FIG. 5D. The NFET gate structure has gate dielectric 311, metal/nitride layer 511, and polysilicon cap layer 551; the PFET gate structure has gate dielectric 312, metal nitride layer 322, metal/nitride layer 512, and polysilicon cap layer 552. As discussed above, layers 551 and 552 may be formed from a common material.

Fabrication Process: Replacement Gate

Figure 6A:
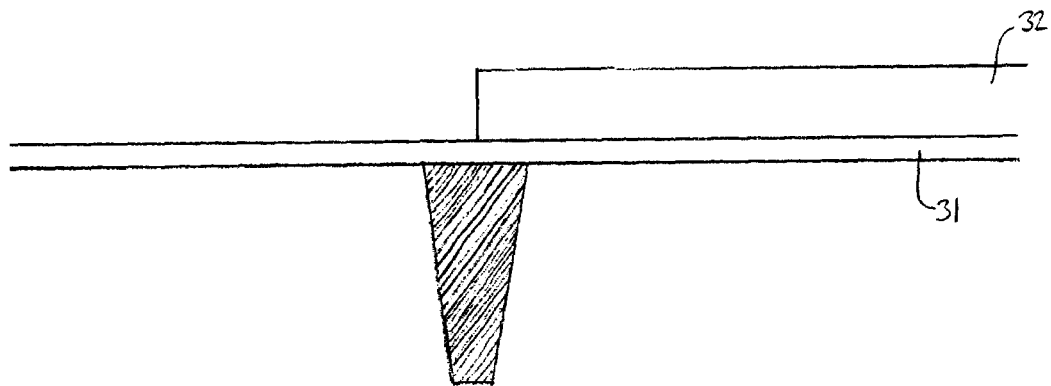
FIGS. 6A–6C illustrate steps in a replacement gate process in accordance with another embodiment of the invention.
Figure 6B:
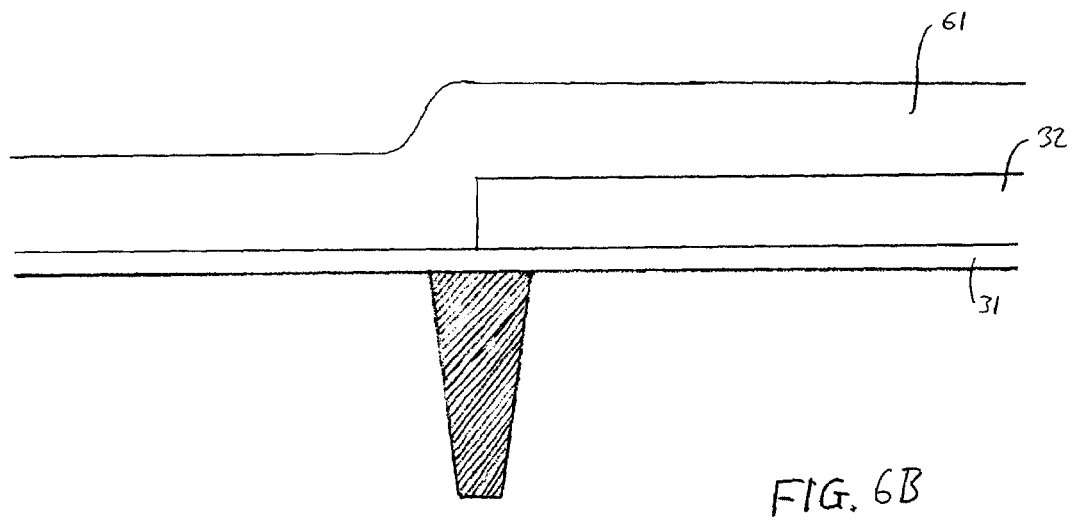
Figure 6C:
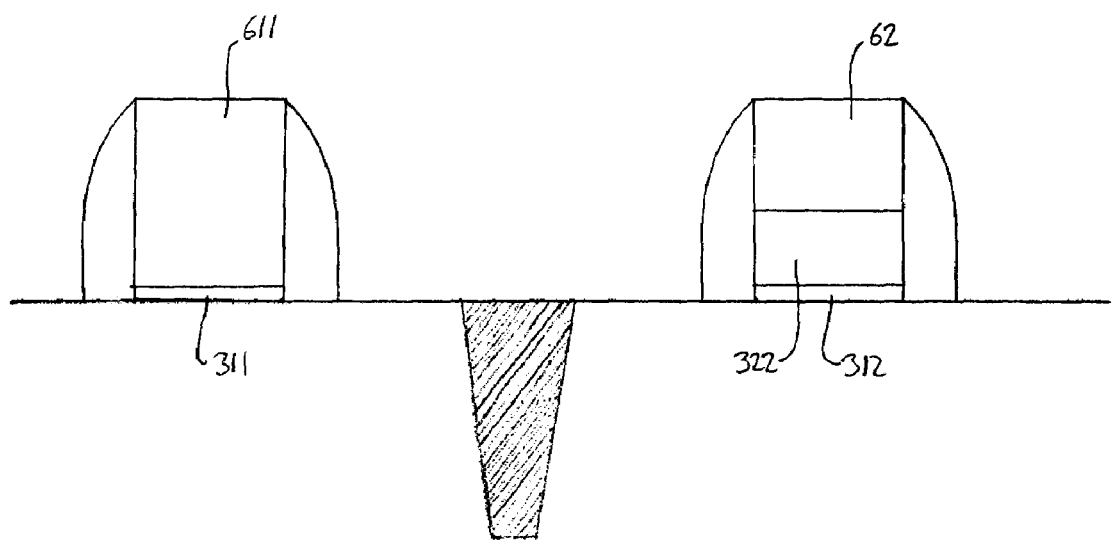

One or both of the NFET and PFET gate structures may be fabricated using a replacement-gate approach. For example, a metal nitride layer 32 with a high concentration of nitrogen may be patterned and etched away from the NFET region (FIG. 6A), and a polysilicon layer 61 deposited over both regions (FIG. 6B). Conventional CMOS processing of this arrangement results in the gate structures shown in FIG. 6C. The NFET gate structure has a polysilicon electrode 611; the PFET gate structure has a metal nitride layer 322 with a polysilicon cap 62 overlying the metal nitride. At this point the PFET gate structure may be masked, and the NFET gate structure treated as a dummy polysilicon gate; polysilicon electrode 611 may be replaced by a metal, nitride or other material, or be converted to a silicide. Alternatively, layers 611 and 62 may both be converted to a silicide, since metal nitride layer 322 is an effective barrier to low-formation-temperature silicides (e.g. CoSi, PtSi, PdSi or NiSi). Layers 611 and 62 may contain dopants which serve to adjust the workfunction of the resultant NFET gate electrode, suitable for a high-performance NFET.

Figure 7A:
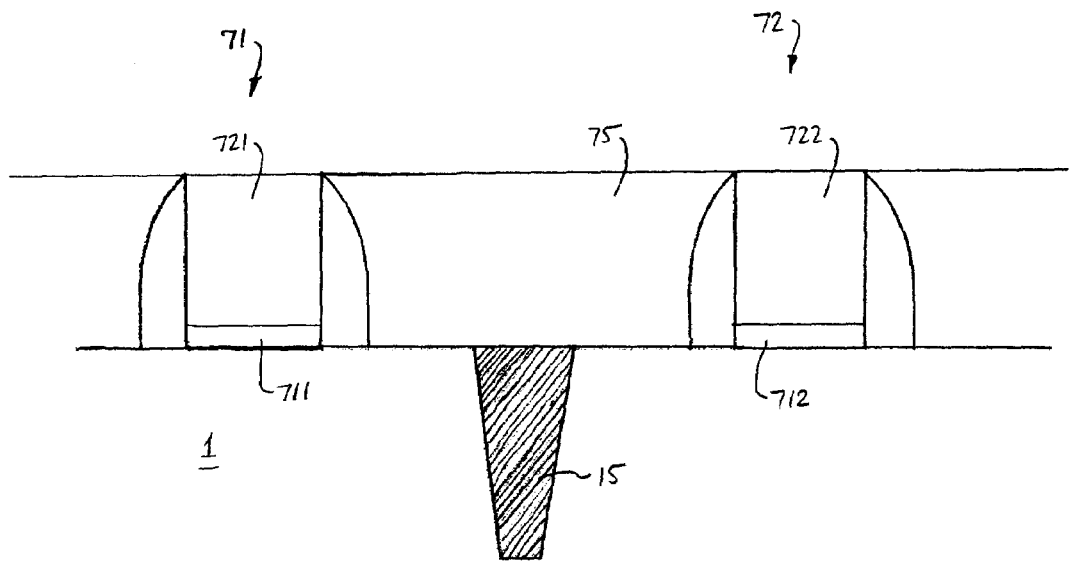
FIGS. 7A–7C illustrate steps in a replacement gate process in accordance with another embodiment of the invention.
Figure 7B:
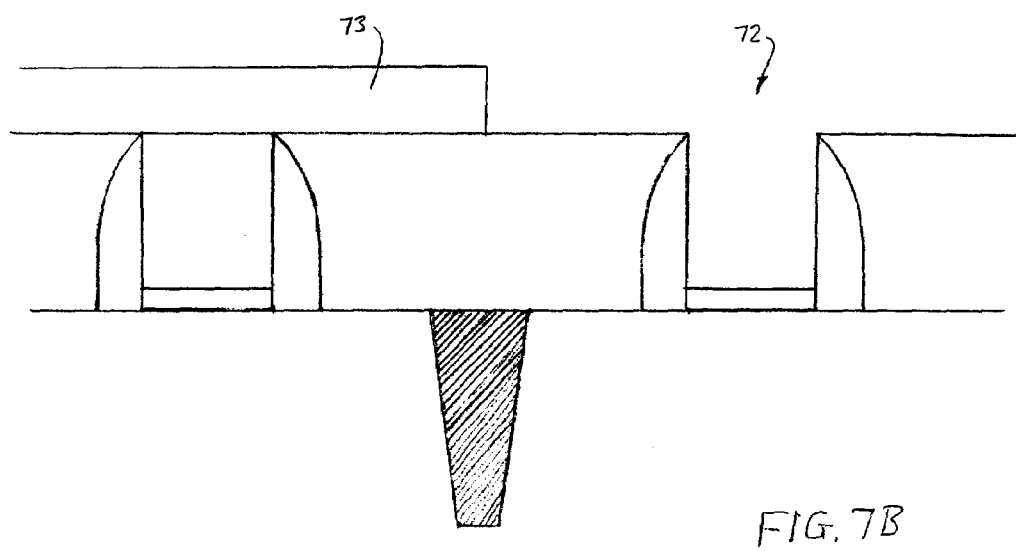
Figure 7C:
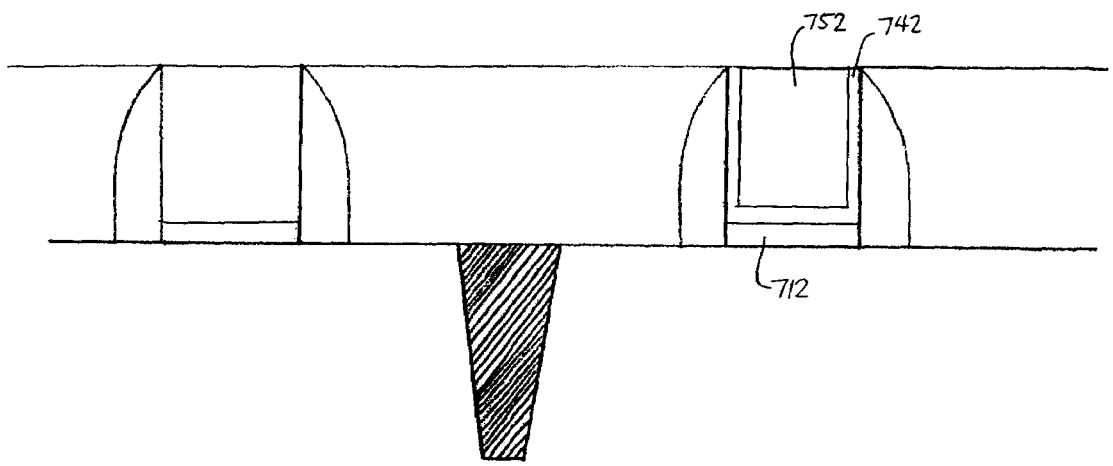

The NFET and PFET gate structures may also be formed using a damascene process (details of which are known in the art). FIG. 7A shows NFET gate structure 71 and PFET structure 72 formed on substrate 1; the gate structures are separated by planarized dielectric 75 and isolation 15. The gate structures have gate dielectric layers 711, 712 and polysilicon electrodes 721, 722 respectively. A replacement-gate process for forming a PFET having a metal nitride layer is shown in FIGS. 7B and 7C. The NFET gate structure is masked by patterned mask 73, and the dummy polysilicon electrode 722 is removed from gate structure 72 using a selective etch process. The PFET gate structure may then be filled with a metal nitride (preferably $WN_x$ with x>0.7). Alternatively, the metal nitride may be deposited as a liner 742 in the interior of the structure, and another conductor (such as a metal) 752 deposited to fill the structure (see FIG. 7C). After these deposition steps, the substrate is again planarized to expose the surface of dielectric 75 and the tops of both gate structures, as shown in FIG. 7C.

Figure 8A:
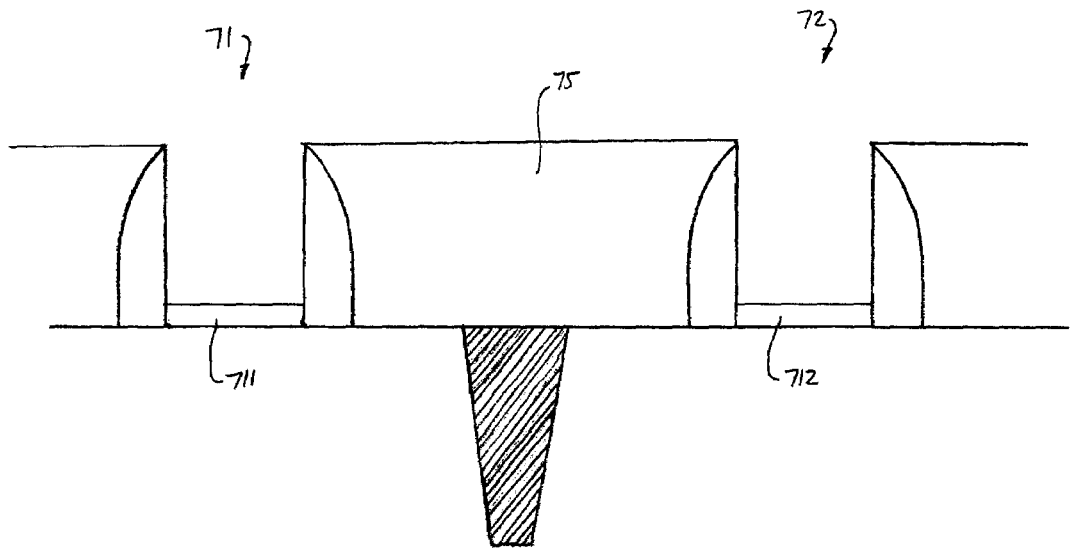
FIGS. 8A–8D illustrate steps in a replacement gate process in accordance with another embodiment of the invention.
Figure 8B:
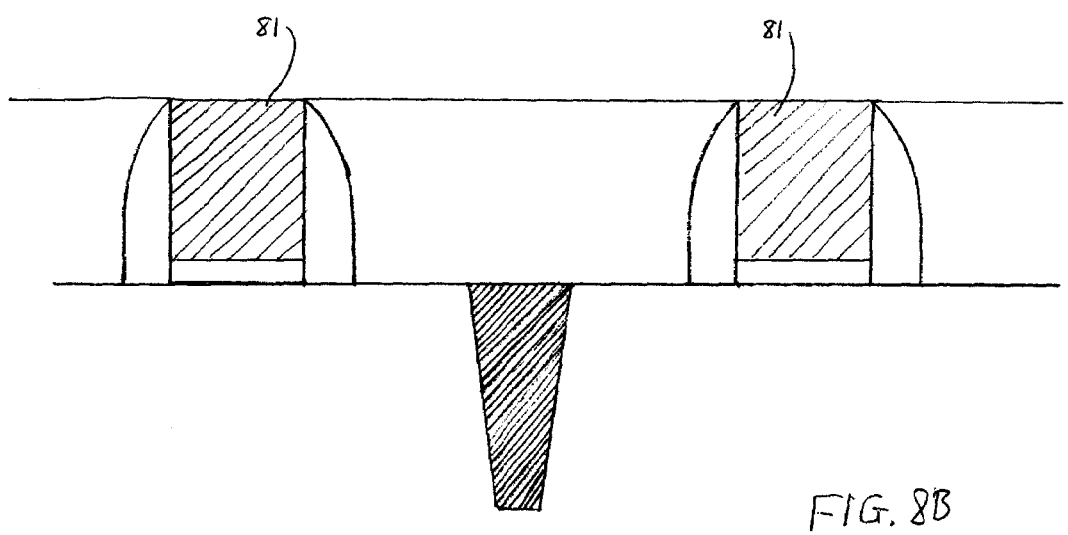
Figure 8C:
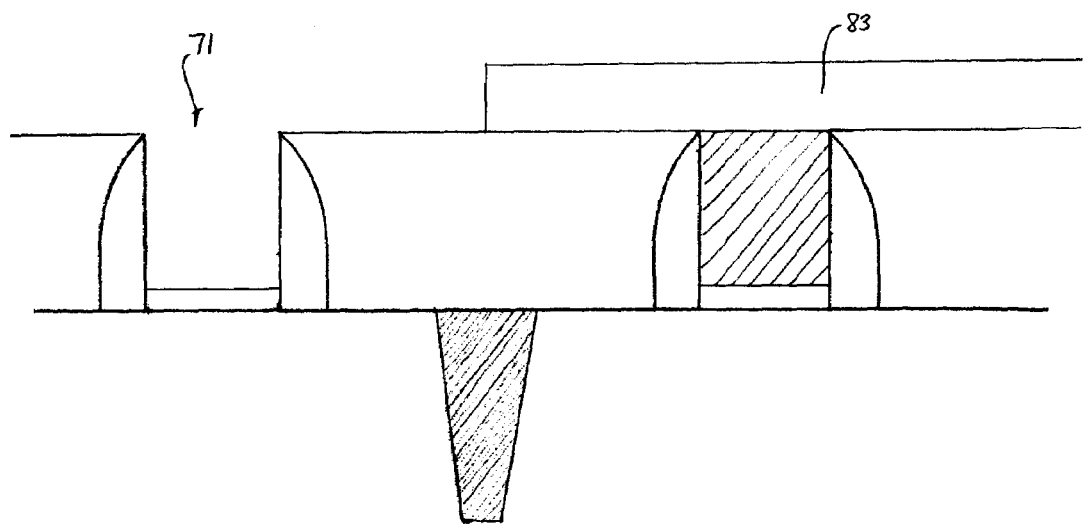
Figure 8D:
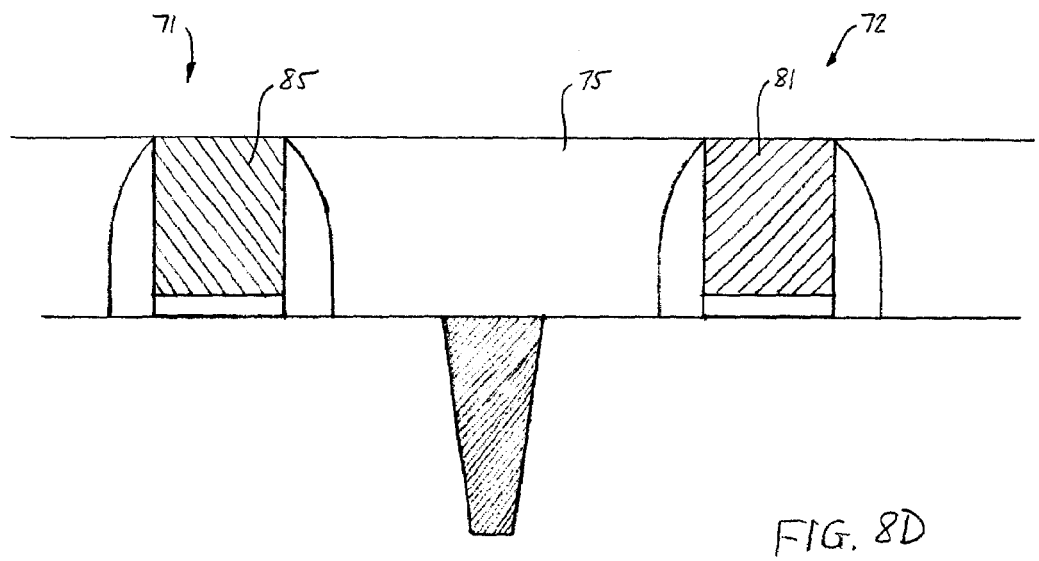

Another possible replacement-gate process is shown in FIGS. 8A–8D. The NFET and PFET gate structures are first fabricated using a damascene process, as in FIG. 7A. The dummy polysilicon gate electrodes are then removed from both gate structures (FIG. 8A). Both gate structures are then filled with material 81 (FIG. 8B). In this example, the gate structures are filled with $WN_x$ having x>0.7. A sacrificial mask 83 is deposited and patterned so that the NFET gate structure 71 is exposed. The fill material 81 is then removed from structure 71 (FIG. 8C). A different material 85 is then used to replace the electrode in gate structure 71; in this example, material 85 may be a metal or a metal nitride. A planarization process such as chemical-mechanical polishing (CMP) is then performed, resulting in the structure shown in FIG. 8D (compare FIG. 2B). Either or both of the gate structure fillings 81, 85 may instead be a combination of a liner with an interior fill, as noted above with reference to FIG. 7C.

Experimental Results

Figure 9:
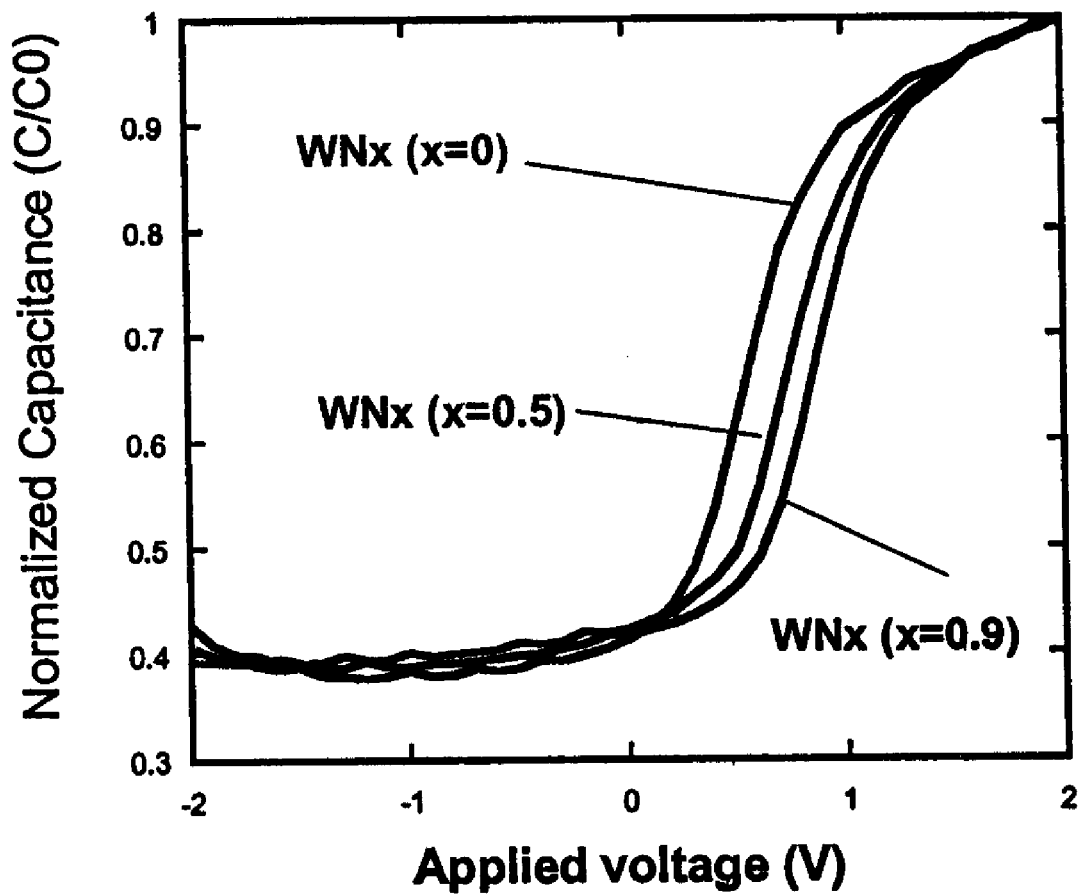
FIG. 9 shows some electrical characteristics of devices fabricated in accordance with the present invention.

FIG. 9 shows the C-V characteristics of an MOS capacitor structure built of layers of $WN_x$ on a high-k dielectric stack of $HfO_2$, and $SiO_2$ on an n-Si substrate. It may be seen that the flat-band voltage is a strong function of x. A capacitor with x=0.9 exhibits a flat-band voltage 0.35 V higher than with x=0 (pure W). As is understood in the art, it follows that pure W has a midgap work function of 4.65 to 4.75 eV while $WN_x$, x=0.9, has a workfunction between 5.0 and 5.1 eV. Accordingly, increasing the nitrogen content in a tungsten nitride film has a beneficial effect in the fabrication of PFET gate structures.

Figure 10:
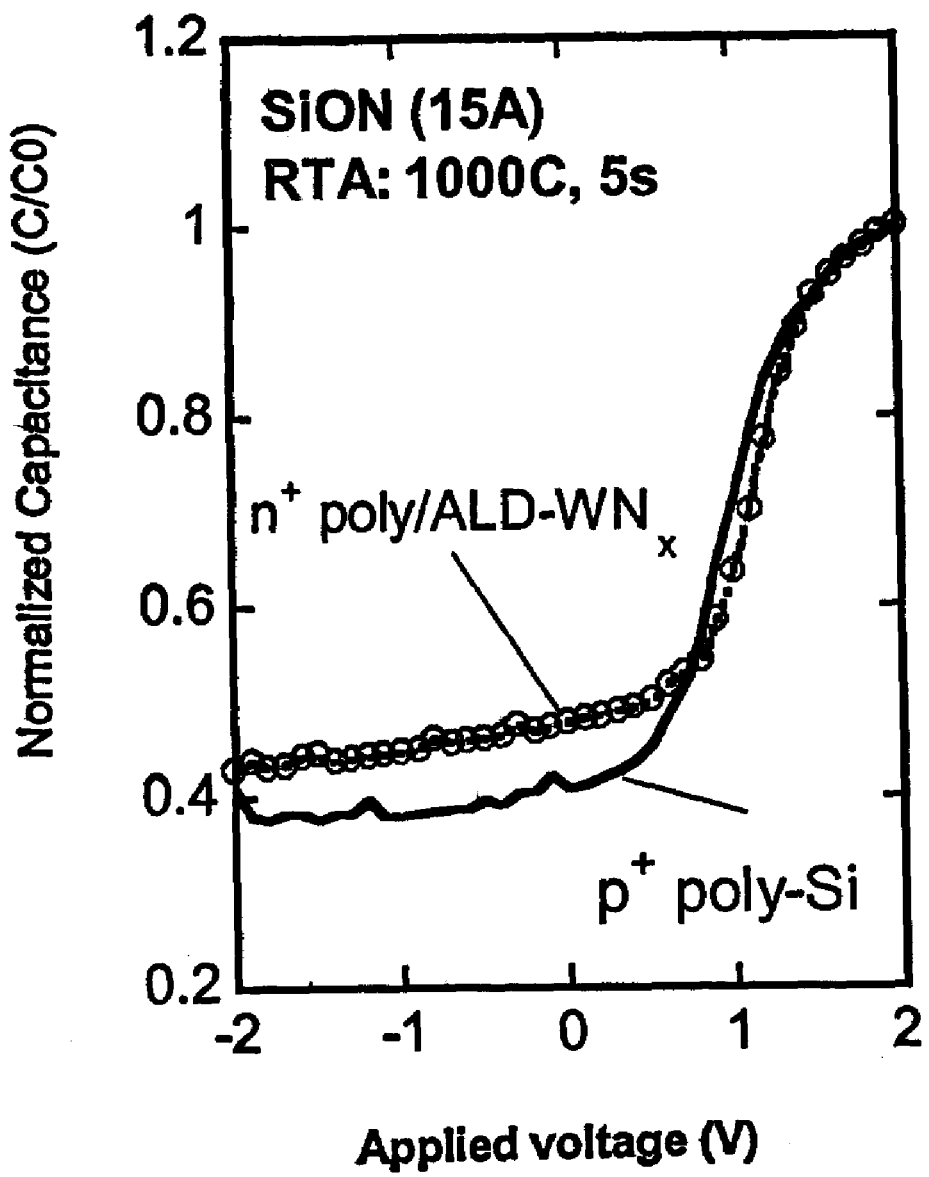
FIG. 10 shows experimental results regarding the thermal stability of devices fabricated in accordance with the present invention.

FIG. 10 compares the C-V characteristics of two capacitor structures, built of layers of tungsten nitride on an oxynitride dielectric, after a 5 second rapid thermal anneal (RTA) at 1000° C. The capacitor structure including $WN_x$ x=0.9, shows a characteristic very similar to a structure including polysilicon. This indicates the thermal stability of the structure including $WN_x$. Furthermore, this demonstrates that tungsten nitride on oxynitride exhibits the same or a similar workfunction as that of tungsten nitride on a high-k dielectric (as shown in FIG. 9).

The dissociation temperature in tungsten nitride, incorporated in various structures, was determined using X-ray diffraction. Measurement of the diffraction angle indicates the presence of a particular crystalline structure; accordingly, any phase transition in the crystalline structure can be detected. The results are shown below in Table 1.

TABLE 1

$WN_x$ dissociation temperatures in various structures

| Structure | X | $WN_x$ dissociation temperature |
|---|---|---|
| $WN_x/SiO_2$/substrate | 0.5 | 780° C. |
| $WN_x/SiO_2$/substrate | 0.9 | 780° C. |
| polySi/$WN_x/SiO_2$/substrate | 0.5 | 920° C. |
| polySi/$WN_x/SiO_2$/substrate | 0.9 | 1000° C. |

These results indicate the effectiveness of a polysilicon covering layer in preventing dissociation of the tungsten nitride (and hence loss of nitrogen from the nitride layer) during high-temperature processing steps. Using a polysilicon covering layer (such as mask layer 33 in FIGS. 3B-1 and 3B-2) thus permits control of the nitrogen content of the nitride layer during CMOS processing, which in turn permits the workfunction in the PFET gate structure to be fixed.

PFETs incorporating the present invention have been fabricated and tested in comparison with devices not including $WN_x$ in the gate structure. These devices exhibited a substantially reduced polysilicon depletion effect, and an increase in the drive current of about 20%.

The present invention thus offers a number of important advantages. Using a tungsten nitride layer, $WN_x$ with x variable, permits integration of different FET characteristics on the same chip. In addition, varying x in the $WN_x$ layer permits adjustment of the threshold voltage in the different FETs. The polysilicon depletion effect is substantially reduced, and the gate structure can be made thermally stable up to 1000° C.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

The invention claimed is:

1. An integrated circuit formed on a substrate, comprising:
   an NFET device having a first gate structure including
      a first gate dielectric on the substrate; and
      a first metal nitride layer overlying the first gate dielectric and in contact therewith, said first metal nitride layer being characterized as $MN_x$, where M is one of W, Re, Zr, and Hf, and x is less than about 0.7; and
   a PFET device having a second gate structure including
      a second gate dielectric on the substrate; and
      a second metal nitride layer overlying the second gate dielectric and in contact therewith, said second metal nitride layer being characterized as $MN_x$, where M is one of W, Re, Zn and Hf, and x is in the range of about 0.7 to about 1.5,
   wherein the second gate structure further includes a layer of polysilicon overlying the second metal nitride layer, and said polysilicon layer is effective to render the second gate structure substantially stable with respect to temperature at temperatures up to about 1000° C.

2. An integrated circuit according to claim 1, wherein in the second metal nitride layer x is about 0.9.

3. An integrated circuit according to claim 1, wherein the first metal nitride layer has a thickness of less than about 100 Å.

4. An integrated circuit according to claim 1, wherein the first metal nitride layer is tungsten nitride.

5. An integrated circuit according to claim 1, wherein the first gate structure further includes a layer of polysilicon overlying the first metal nitride layer.

6. An integrated circuit according to claim 5, wherein said polysilicon layer overlying the first metal nitride layer is effective to render the first gate structure substantially stable with respect to temperature at temperatures up to about 1000° C.

7. An integrated circuit according to claim 1, wherein the first gate structure further includes a layer of silicide overlying the first metal nitride layer.

8. An integrated circuit according to claim 1, wherein the second metal nitride layer has a thickness of less than about 100 Å.

9. An integrated circuit according to claim 1, wherein the second metal nitride layer is tungsten nitride.

10. An integrated circuit according to claim 1, wherein the second gate structure further includes a layer of silicide overlying the second metal nitride layer.

* * * * *